(12) United States Patent
Vellianitis

(10) Patent No.: US 11,901,451 B2
(45) Date of Patent: Feb. 13, 2024

(54) METHOD OF FABRICATING SEMICONDUCTOR DEVICE

(71) Applicant: Taiwan Semiconductor Manufacturing Company, Ltd., Hsinchu (TW)

(72) Inventor: Georgios Vellianitis, Heverlee (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/155,075

(22) Filed: Jan. 17, 2023

(65) Prior Publication Data
US 2023/0170419 A1 Jun. 1, 2023

Related U.S. Application Data

(62) Division of application No. 17/076,813, filed on Oct. 22, 2020, now Pat. No. 11,569,382.

(60) Provisional application No. 63/038,922, filed on Jun. 15, 2020.

(51) Int. Cl.
| | |
|---|---|
| *H01L 29/66* | (2006.01) |
| *H01L 29/78* | (2006.01) |
| *H01L 29/51* | (2006.01) |
| *H01L 29/20* | (2006.01) |

(52) U.S. Cl.
CPC .... *H01L 29/78391* (2014.09); *H01L 29/2003* (2013.01); *H01L 29/516* (2013.01); *H01L 29/6684* (2013.01)

(58) Field of Classification Search
CPC ........... H01L 29/78391; H01L 29/2003; H01L 29/516; H01L 29/6684; H01L 21/02439; H01L 21/02458; H01L 21/02502; H01L 21/0262; H01L 21/02631; H01L 29/1054; H01L 29/518; H01L 29/66446
USPC ........................................................... 257/76
See application file for complete search history.

(56) References Cited

U.S. PATENT DOCUMENTS

| | | | |
|---|---|---|---|
| 11,423,967 B1 * | 8/2022 | Dokania | G11C 11/221 |
| 2009/0057737 A1 | 3/2009 | Boescke et al. | |
| 2009/0127603 A1 * | 5/2009 | Yamakawa | H10B 53/30 |
| | | | 257/E27.113 |
| 2009/0261395 A1 | 10/2009 | Boescke | |
| 2011/0002154 A1 * | 1/2011 | Mitani | H10B 63/20 |
| | | | 257/E45.001 |
| 2014/0355328 A1 * | 12/2014 | Muller | G11C 11/2275 |
| | | | 257/295 |

(Continued)

OTHER PUBLICATIONS

"Office Action of U.S. Related Application, U.S. Appl. No. 17/874,316", dated Oct. 13, 2023, p. 1-p. 10.

*Primary Examiner* — Sheikh Maruf
(74) *Attorney, Agent, or Firm* — JCIPRNET

(57) ABSTRACT

A method of fabricating a semiconductor device is described. A first material layer is formed, wherein the first material layer contains crystalline aluminum nitride or aluminum scandium nitride (AlScN) with a first Sc content. A second material layer is formed on the first material layer, wherein the second material layer contains aluminum scandium nitride (AlScN) with a second Sc content higher than the first Sc content. A third material layer is formed on the second material layer, wherein the third material layer contains aluminum scandium (AlSc).

20 Claims, 11 Drawing Sheets

(56) References Cited

U.S. PATENT DOCUMENTS

| | | | |
|---|---|---|---|
| 2015/0287802 A1* | 10/2015 | Lee | H01L 21/823462 |
| | | | 257/105 |
| 2015/0340372 A1* | 11/2015 | Pandey | H10B 51/30 |
| | | | 257/295 |
| 2015/0380511 A1* | 12/2015 | Irsigler | H01L 29/78391 |
| | | | 257/295 |
| 2017/0162250 A1* | 6/2017 | Slesazeck | G11C 11/2273 |
| 2017/0271460 A1* | 9/2017 | Chang | H01L 28/00 |
| 2018/0175185 A1 | 6/2018 | Chang et al. | |
| 2018/0233573 A1 | 8/2018 | Lin et al. | |
| 2019/0019683 A1 | 1/2019 | Yoo | |
| 2019/0074295 A1* | 3/2019 | Schröder | H01L 28/40 |
| 2019/0115445 A1* | 4/2019 | Teo | H01L 29/517 |
| 2019/0198080 A1* | 6/2019 | Salahuddin | H01L 29/6684 |
| 2019/0198606 A1 | 6/2019 | Nahar et al. | |
| 2019/0198638 A1 | 6/2019 | Van Houdt et al. | |
| 2019/0244973 A1 | 8/2019 | Yoo | |
| 2020/0152747 A1* | 5/2020 | Gwoziecki | H01L 29/516 |
| 2021/0151445 A1 | 5/2021 | Wagner et al. | |

* cited by examiner

US 11,901,451 B2

METHOD OF FABRICATING SEMICONDUCTOR DEVICE

CROSS-REFERENCE TO RELATED APPLICATION

This application is a divisional application of and claims the priority benefit of U.S. patent application Ser. No. 17/076,813, filed on Oct. 22, 2020, which claims the priority benefit of U.S. provisional application Ser. No. 63/038,922, filed on Jun. 15, 2020. The entirety of each of the above-mentioned patent applications is hereby incorporated by reference herein and made a part of this specification.

BACKGROUND

Field-effect transistors (FET) are three terminal semiconductor devices, with source, drain and gate terminals. Controlled by the voltage applied to the gate, the current flows between the source and drain through the conducting channel region.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
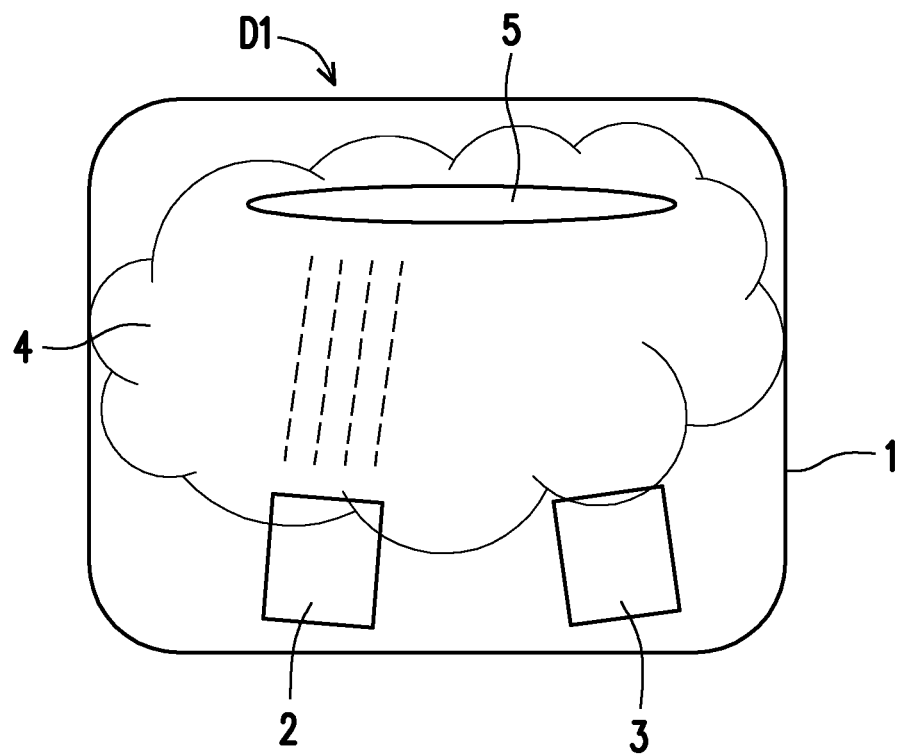
FIG. 1A, FIG. 2A, FIG. 3A and FIG. 4A are schematic views showing the operation of a deposition chamber and the deposition reactions at certain stages of the method of forming the transistor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A ferroelectric field effect transistor (FE-FET) is a transistor that includes a ferroelectric material sandwiched between the gate electrode and source-drain conduction region of the device. Ferroelectric materials have a charge polarization that can be switched in direction by an applied electric field. Promising ferroelectric materials including aluminum scandium nitride (AlScN) alloys have been developed and synthesized. Aluminum nitride (AlN) has the wurtzite crystal structure, and AlN has strong spontaneous polarization and piezoelectric effects. Introducing certain amounts of scandium into AlN increases the piezoelectric effect while the wurtzite structure is maintained.

FIG. 1 to FIG. 8 are schematic cross-sectional views showing various stages in a method of forming a transistor device in accordance with some embodiments of the present disclosure. FIG. 1A, FIG. 2A, FIG. 3A and FIG. 4A are schematic views showing the operation of a deposition chamber and the deposition reactions at certain stages of the method of forming the transistor device in accordance with some embodiments of the present disclosure. The process of fabricating the transistor device according to some embodiments will be described in detail below.

Figure 1:
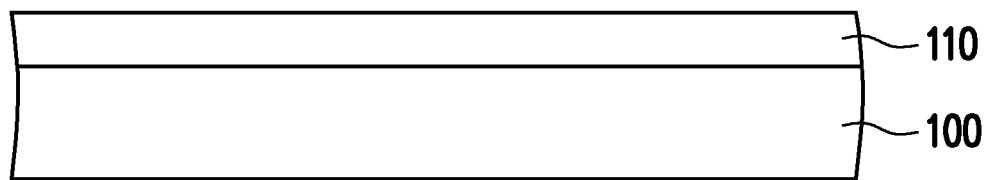
FIG. 1 to FIG. 8 are schematic cross-sectional views showing various stages in a method of forming a transistor device in accordance with some embodiments of the present disclosure.

FIG. 1A is a schematic view showing the operation of a deposition chamber and the deposition reaction at one stage corresponding to the process of the method of forming a transistor device as shown in FIG. 1 in accordance with some embodiments of the present disclosure. Referring to FIG. 1A and FIG. 1, a base material 100 is provided, and then a first material layer 110 is formed over the base material 100. The material of the base material 100 includes a semiconductor material. In some embodiments, the material of the base material 100 is a semiconductor material such as silicon, germanium (Ge) or a suitable semiconductor material. Suitable semiconductor materials include diamond, compound semiconductor materials such as gallium arsenide (GaAs), indium arsenide, aluminum nitride (AlN), gallium nitride (GaN), silicon carbide (SiC), or indium phosphide (InP), and alloy semiconductor materials such as silicon germanium, silicon germanium carbide, gallium arsenide phosphide, gallium indium phosphide, aluminum gallium arsenide, aluminum indium arsenide, or aluminum gallium indium phosphide. The selection of the materials is not limited to the disclosure herein. In embodiments, the material of the base material 100 includes silicon, germanium, gallium arsenide or aluminum nitride or a combination thereof. In one embodiment, the material of the base material 100 includes a crystalline material, and the base material may function as seed for the crystalline growth or deposition of the above layer(s). In one embodiment, the base material 100 is made of a crystalline material with a thickness thick enough to support the above structure(s) and for segregation. In one embodiment, the crystalline material may be formed by epitaxial growth or provided in bulk and then cut into desirable shapes. It is understood that further carrying or supporting structure (not shown) may be provided beneath the base material 100 for handling or supporting purposes. In some embodiments, the materials of the first material layer 110 and the base material 100 are substantially the same. In some embodiments, the materials of the first material layer 110 and the base material 100 are different.

Referring to FIG. 1A and FIG. 1, a deposition chamber 1 is provided with a first target source 2 and a second target source 3 arranged within the deposition chamber 1. During the deposition reaction, the first and second target sources 2, 3 may be functioning individually or in cooperation. That means the first target source may be functioning while the second target source may stop functioning and vice versa. In addition, the first and second target sources 2, 3 may be functioning at the same time, functioning in sequence, or functioning on pulses (i.e. increasing one and reducing the other for some periods and then vice versa). Also, the deposition chamber 1 is provided with a reactive gas 4 as part of the reactants for the deposition reaction, and an object 5 is placed within the deposition chamber 1 undergoing the deposition reaction(s) to form deposited layers or films thereon. The source of the reactive gas 4 is not shown herein for simplicity but it is understood that the supply amount and speed of the reactive gas may be well controlled by the source and the details will not be described herein. In one embodiment, the object 5 of FIG. 1A may be a carrier or a wafer including the base material 100 (as seen in FIG. 1) thereon.

Referring to FIG. 1A and FIG. 1, a first deposition D1 is performed within the chamber 1 where the first target source 2 is functioning along with the reactive gas 4 filled in the chamber 1, so that the first material layer 110 is formed and grown over the base material 100. In some embodiments, the first material layer 110 is formed by chemical vapor deposition (CVD), such as plasma enhanced CVD (PECVD), low-pressure CVD (LPCVD), metal organic CVD (MOCVD), or atomic layer deposition (ALD). In some embodiments, the first material layer 110 is formed by epitaxy growth such as molecular beam epitaxy (MBE). In some embodiments, the first material layer 110 is formed by physical vapor deposition (PVD) such as evaporation, sputtering or ion plating.

For example, within the deposition chamber 1, the first target source 2 supplies at least a Group III element, the second target source 3 supplies at least a rare-earth element, and the reactive gas 4 supplies at least a Group V element.

In one embodiment, the deposition chamber 1 is a PVD chamber, the first target source 2 includes a Group III element metal or alloys as the first target material, and the second target source 3 includes a rare-earth element metal or alloys as the second target material. Within the chamber 1, the first deposition D1 includes performing a PVD process (such as sputtering) under the reactive gas 4 with the first target source 2 functioning and the second target source 3 not-functioning, and the PVD process involves ejecting the first target material (shown as the dashed lines in FIG. 1A) from the first target source 2, reacting the first target material with the reactive gas 4 and depositing the resultant compound onto the object 5. In one embodiment, the first target source 2 includes aluminum (Al) or alloys, the second target source 3 includes scandium (Sc) or alloys, and the reactive gas is gaseous nitrogen, and the deposited first material layer 110 is made of aluminum nitride (AlN) formed by PVD under a reaction temperature ranging from the room temperature to 600° C.

In alternative embodiments, the deposition chamber 1 is a CVD chamber, the first target source 2 includes a precursor containing Group III element as the first target material, and the second target source 3 includes a precursor containing a rare-earth element as the second target material. In one embodiment, the first deposition D1 includes performing a CVD process, the first target source 2 includes an aluminum precursor (such as trimethylaluminum, TMA), the second target source 3 includes a scandium (Sc) precursor, and the reactive/carrier gas is gaseous nitrogen/argon, and the deposited first material layer 110 is made of aluminum nitride (AlN) formed by CVD under a reaction temperature ranging from the room temperature to 700° C. In one embodiment, the first deposition D1 includes performing a MOCVD process with a reaction temperature ranging from 400° C. to 700° C. In one embodiment, the first deposition D1 includes performing an ALD process with a reaction temperature ranging from the room temperature to 500° C.

Figure 2A:
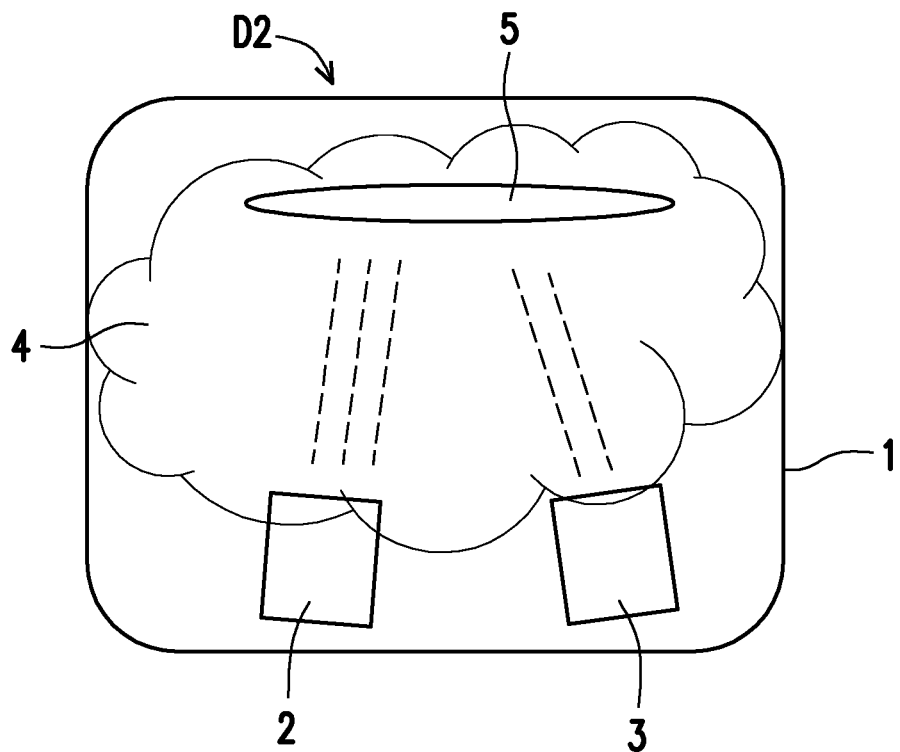
Figure 2:
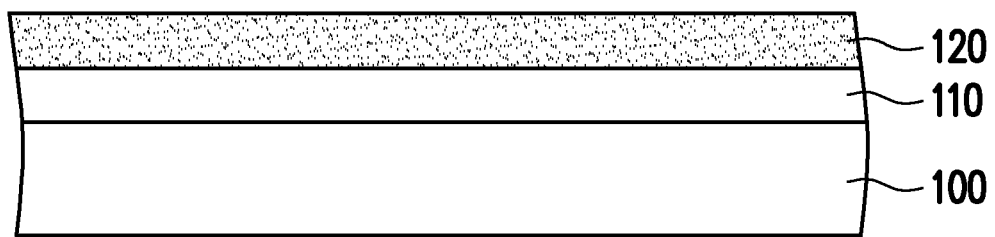

FIG. 2A is a schematic view showing the operation of a deposition chamber and the deposition reaction at one stage corresponding to the process of the method of forming a transistor device as shown in FIG. 2 in accordance with some embodiments of the present disclosure. Referring to FIG. 2A and FIG. 2, a second material layer 120 is formed over the first material layer 110. In some embodiments, as shown in FIG. 2A, within the same deposition chamber 1, a second deposition D2 is performed within the chamber 1 where the first target source 2 and the second target source 3 are functioning along with the reactive gas 4 filled in the chamber 1, so that the second material layer 120 is formed and grown over the first material layer 110 and the base material 100. In certain embodiments, the first material layer 110 is made of a crystalline material and functions as seed template for the later formed second material layer 120. In some embodiments, the second material layer 120 is formed by CVD, such as PECVD, LPCVD, MOCVD, ALD. In some embodiments, the second material layer 120 is formed by epitaxy growth such as MBE. In some embodiments, the second material layer 120 is formed by PVD such as evaporation, sputtering or ion plating.

In one embodiment, within the same deposition chamber 1, the deposition chamber 1 is the PVD chamber, the first target source 2 includes a Group III element metal or alloys as the first target material, and the second target source 3 includes a rare-earth element metal or alloys as the second target material. In some embodiments, the second deposition D2 includes performing a PVD process (such as sputtering) under the reactive gas 4 with the first target source 2 functioning and the second target source 3 functioning, and the PVD process involves simultaneously ejecting the first and second target materials (shown as the dashed lines in FIG. 2A) from the first and second target sources 2 and 3, reacting the first and second target materials with the reactive gas 4 and depositing the resultant compound onto the object 5. The ejecting amount of the first target material may be the same as or may be different from the ejecting amount of the second target material, when both sources 2 and 3 are functioning. In one embodiment, the ejecting amount of the first target material may be more than the ejecting amount of the second target material. In one embodiment, the first target source 2 includes aluminum (Al) or alloys, the second target source 3 includes scandium (Sc) or alloys, and the reactive gas is gaseous nitrogen, and the deposited second material layer 120 is made of aluminum scandium nitride (AlScN) formed by PVD under a reaction temperature ranging from the room temperature to 600° C. In one embodiment, the second material layer 120 is an AlScN layer having a thickness ranging from about 10 nm to 100 nm. Taking magnetron sputtering as an example, the crystalline AlScN layer is formed by sputtering onto the MN layer while dual target sources are used, and the nitrogen gas is supplied along with argon gas and the reaction temperature ranges from the room temperature to 600° C., or from 350° C. to 600° C.

In alternative embodiments, the deposition chamber 1 is the CVD chamber, the first target source 2 includes a precursor containing Group III element as the first target material, and the second target source 3 includes a precursor containing a rare-earth element as the second target material. In one embodiment, the second deposition D2 includes performing a CVD process, the first target source 2 includes an aluminum precursor (such as trimethylaluminum, TMA), the second target source 3 includes a scandium (Sc) precursor, and the reactive/carrier gas is gaseous nitrogen/argon, and the deposited second material layer 120 is made of aluminum scandium nitride (AlScN) formed by CVD. In one embodiment, the second deposition D2 includes performing a MOCVD process with a reaction temperature ranging from 400° C. to 700° C. In one embodiment, the second deposition D2 includes performing an ALD process with a reaction temperature ranging from the room temperature to 500° C.

In some embodiments, the second material layer 120 is an AlScN layer having a scandium (Sc) content larger than zero but smaller than 22% (atomic percentage). That is, the second material layer 120 is an aluminum-rich AlScN layer with a Sc content smaller than 22% (i.e. 0%<Sc<22%), and the aluminum-rich (Al-rich) AlScN may be denoted as $Al_{(1-x)}Sc_{(x)}N$, where 0<x<0.22. Herein, the AlScN layer with a Sc content larger than zero and smaller than 22% (i.e. 0%<Sc<22%) may be referred as a "low-Sc content" AlScN layer. The Al-rich AlScN layer may be a wurtzite-type AlScN layer. In some embodiments, the second material layer 120 may have a Sc gradient starting from 0.1% to 22%. In one embodiment, with the Sc gradient of the second material layer 120 changing from the layer 110 toward the above layer, the lattice constant of the second material layer 120 is gradually changed from the layer 110 toward the above layer, functioning as strain relaxed buffer.

Figure 3A:
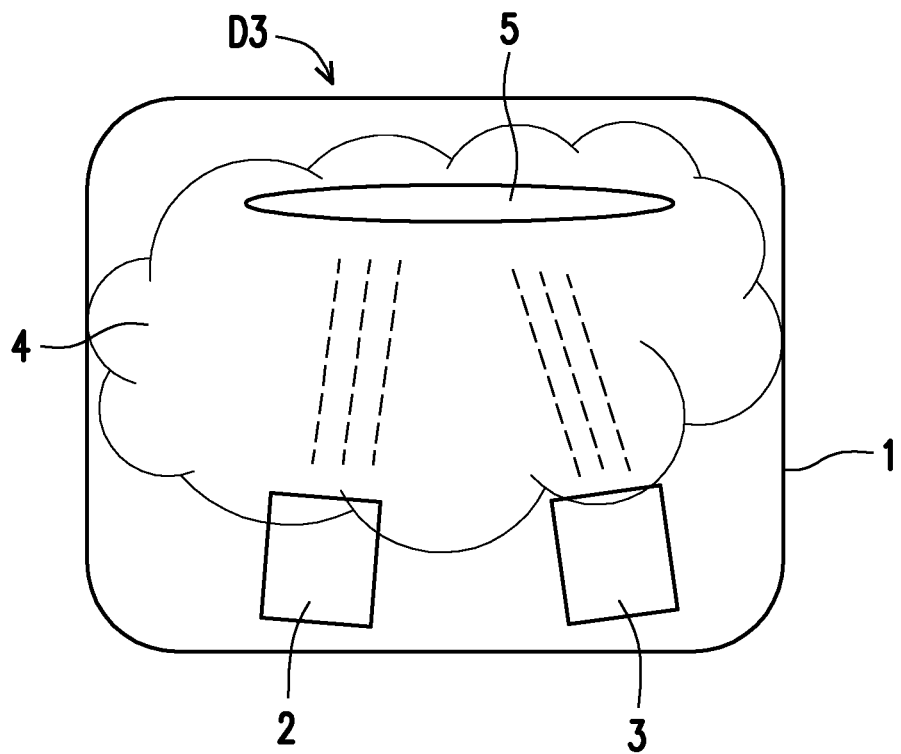
Figure 3:
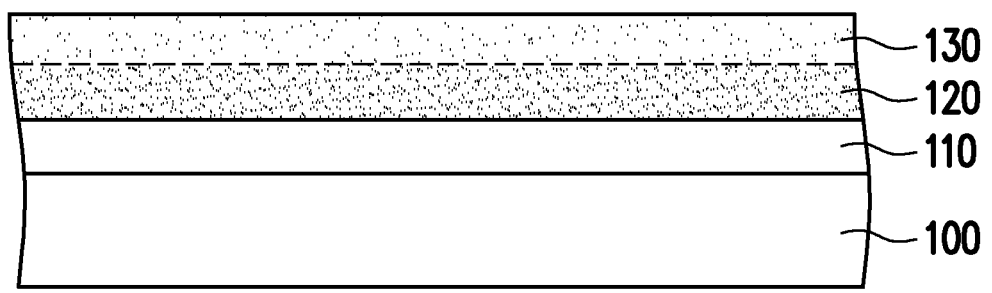

FIG. 3A is a schematic view showing the operation of a deposition chamber and the deposition reaction at one stage corresponding to the process of the method of forming a transistor device as shown in FIG. 3 in accordance with some embodiments of the present disclosure. Referring to FIG. 3A and FIG. 3, a third material layer 130 is formed over the second material layer 120 and above the first material layer 110. In some embodiments, as shown in FIG. 3A, within the same deposition chamber 1, a third deposition D3 is performed within the chamber 1 where the first target source 2 and the second target source 3 are functioning along with the reactive gas 4 filled in the chamber 1, so that the third material layer 130 is formed and deposited over the second material layer 120, the first material layer 110 and the base material 100. In some embodiments, the third material layer 130 is formed by CVD, such as PECVD, LPCVD, MOCVD, or ALD. In some embodiments, the third material layer 130 is formed by epitaxy growth such as MBE. In some embodiments, the third material layer 130 is formed by PVD such as evaporation, sputtering or ion plating.

In one embodiment, the deposition chamber 1 is the PVD chamber, the first target source 2 includes a Group III element metal or alloys as the first target material, and the second target source 3 includes a rare-earth element metal or alloys as the second target material. Within the same chamber 1, the third deposition D3 includes performing a PVD process (such as sputtering) under the reactive gas 4 with the first target source 2 functioning and the second target source 3 functioning, and the PVD process involves simultaneously ejecting the first and second target materials (shown as the dashed lines in FIG. 3A) from the first and second target sources 2 and 3, reacting the first and second target materials with the reactive gas 4 and depositing the resultant compound onto the object 5. The ejecting amount of the first target material may be the same as or may be different from the ejecting amount of the second target material, when both sources 2 and 3 are functioning. In one embodiment, the ejecting amount of the first target material may be more than the ejecting amount of the second target material. In one embodiment, the first target source 2 includes aluminum (Al) or alloys, the second target source 3 includes scandium (Sc) or alloys, and the reactive gas is gaseous nitrogen, and the deposited third material layer 130 is made of aluminum scandium nitride (AlScN) formed by PVD under a reaction temperature ranging from the room temperature to 600° C. In one embodiment, the third material layer 130 is an AlScN layer having a thickness ranging from about 5 nm to 20 nm. Taking magnetron sputtering as an example, the crystalline AlScN layer is formed by sputtering using dual target sources, and the nitrogen gas is supplied along with argon gas and the reaction temperature ranges from the room temperature to 600° C., or from 350° C. to 600° C.

In alternative embodiments, the deposition chamber 1 is the CVD chamber, the first target source 2 includes a precursor containing Group III element as the first target material, and the second target source 3 includes a precursor containing a rare-earth element as the second target material. In one embodiment, the third deposition D3 includes performing a CVD process, the first target source 2 includes an aluminum precursor (such as TMA), the second target source 3 includes a scandium precursor, and the reactive/carrier gas is gaseous nitrogen/argon, and the deposited third material layer 130 is made of aluminum scandium nitride (AlScN) formed by CVD. In one embodiment, the third deposition D3 includes performing a MOCVD process with a reaction temperature ranging from 400° C. to 700° C. In one embodiment, the third deposition D3 includes performing an ALD process with a reaction temperature ranging from the room temperature to 500° C.

In some embodiments, the third material layer 130 is an AlScN layer having a scandium (Sc) content about or larger than 22% but smaller than 50% (atomic percentage, at %). That is, the third material layer 130 is an aluminum-rich AlScN layer with a Sc content equivalent to or larger than 22% and smaller than 50% (i.e. 22%≤Sc≤50%), and the Al-rich AlScN may be denoted as $Al_{(1-x)}Sc_{(x)}N$, where 0.22≤x≤0.50. Herein, the AlScN layer with a Sc content equivalent to or larger than 22% and smaller than 50% may be referred as a "high-Sc content" AlScN layer. In some embodiments, the third material layer 130 may be formed as a single layer with varying Sc contents or Sc content gradients. In some embodiments, the third material layer 130 may be formed as multiple layers with different Sc contents or Sc content gradients. In one embodiment, the low-Sc content AlScN layer may function as a strain relaxed buffer layer (SRB) for the high-Sc content AlScN layer, so that better crystal quality of the high-Sc content AlScN layer is obtained. The high-Sc content AlScN layer is monocrystalline as it is grown on the monocrystalline buffer/seed layer with minimal strain. The high-Sc content AlScN layer may function as a ferroelectric layer. For a ferroelectric transistor that is considered as promising electrically switchable non-volatile data storage elements, as the third material layer 130 (as a ferroelectric layer) in the transistor structure may be formed as multiple layers with different Sc contents or Sc content gradients, the ferroelectric-based memory devices may exhibit programmable multilevel conductance states (i.e. for multiple bits).

Figure 4A:
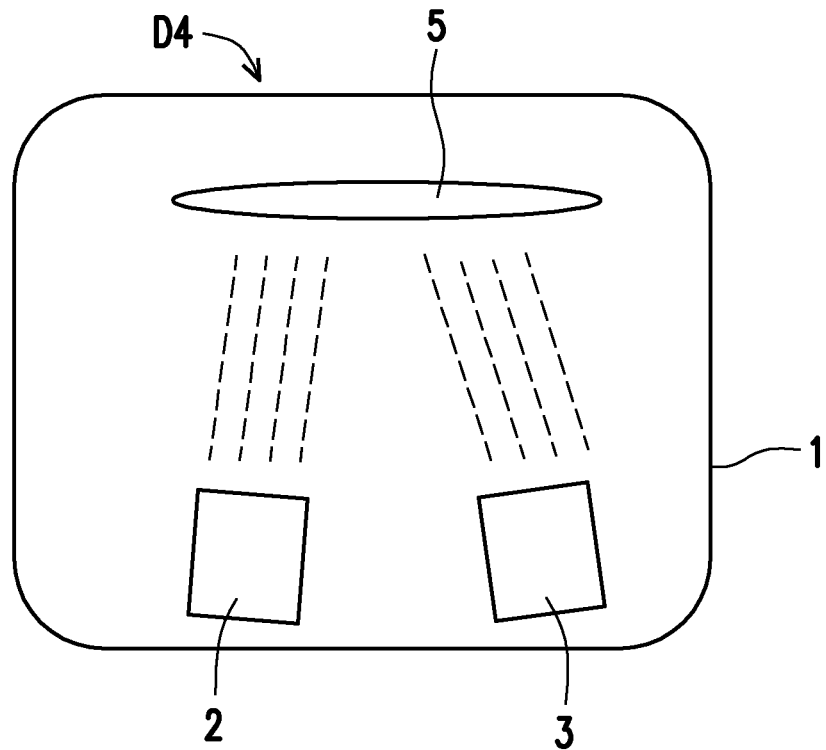
Figure 4:
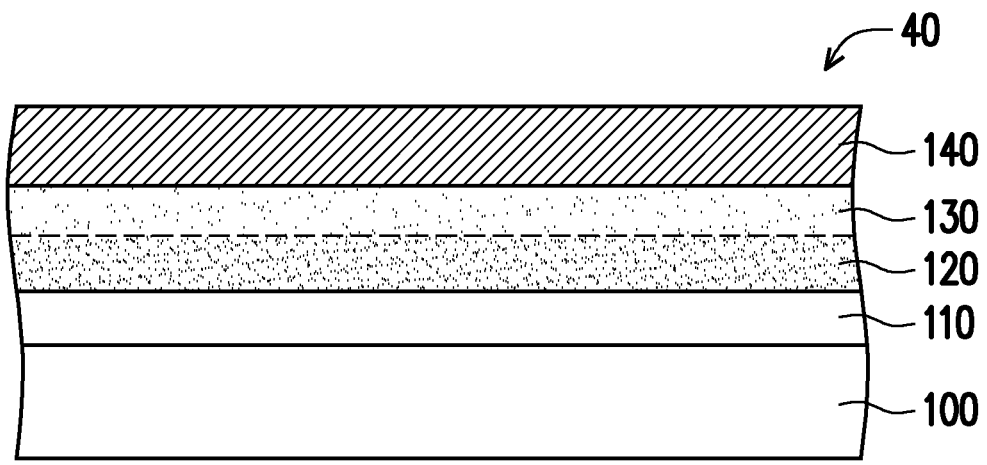

FIG. 4A is a schematic view showing the operation of a deposition chamber and the deposition reaction at one stage corresponding to the process of the method of forming a transistor device as shown in FIG. 4 in accordance with some embodiments of the present disclosure. Referring to FIG. 4A and FIG. 4, a fourth material layer 140 is formed over the third material layer 130 and above the second material layer 120 and the first material layer 110 to form a mass structure 40. In some embodiments, as shown in FIG. 4A, within the same deposition chamber 1, a fourth deposition D4 is performed within the chamber 1 where the first target source 2 and the second target source 3 are functioning without supplying the reactive gas 4 to the chamber 1, so that the fourth material layer 140 is formed and deposited over the third material layer 130, the second material layer 120, the first material layer 110 and the base material 100. In some embodiments, the fourth material layer 140 is formed by CVD, such as PECVD, LPCVD, MOCVD, or ALD. In some embodiments, the fourth material layer 140 is formed by PVD such as evaporation, sputtering or ion plating.

In one embodiment, the deposition chamber 1 is the PVD chamber, the first target source 2 includes a Group III element metal or alloys as the first target material, and the second target source 3 includes a rare-earth element metal or alloys as the second target material. Within the same chamber 1, the fourth deposition D4 includes performing a PVD process (such as sputtering) with the first target source 2 functioning and the second target source 3 functioning, and the PVD process involves simultaneously ejecting the first and second target materials (shown as the dashed lines in FIG. 4A) from the first and second target sources 2 and 3, co-sputtering the first and second target materials and depositing the resultant compound onto the object 5. The ejecting amount of the first target material may be the same as or may be different from the ejecting amount of the second target material, when both sources 2 and 3 are functioning. In one embodiment, the ejecting amount of the first target material may be substantially the same as the ejecting amount of the second target material. In one embodiment, the first target source 2 includes aluminum (Al) or alloys, the second target source 3 includes scandium (Sc) or alloys, using argon as the carrying gas, and the deposited fourth material layer 140 is made of aluminum scandium (AlSc) formed by PVD under a reaction temperature ranging from the room temperature to 600° C. In one embodiment, the fourth material layer 140 is an AlSc layer having a thickness ranging from about 2 nm to 50 nm. Taking magnetron sputtering as an example, the metallic AlSc layer is formed by sputtering using dual target sources with argon gas and the reaction temperature ranges from the room temperature to 600° C., or from 350° C. to 600° C.

In alternative embodiments, the deposition chamber 1 is the CVD chamber, the first target source 2 includes a precursor containing Group III element as the first target material, and the second target source 3 includes a precursor containing a rare-earth element as the second target material. In one embodiment, the fourth deposition D4 includes performing a CVD process, the first target source 2 includes an aluminum precursor (such as TMA), the second target source 3 includes a scandium precursor, and the reactive/carrier gas is gaseous nitrogen/argon, and the deposited fourth material layer 140 is made of aluminum scandium (AlSc) alloy(s) formed by CVD. In one embodiment, the fourth deposition D4 includes performing a MOCVD process with a reaction temperature ranging from 400° C. to 700° C. In one embodiment, the fourth deposition D4 includes performing an ALD process with a reaction temperature ranging from the room temperature to 500° C.

In some embodiments, the fourth material layer 140 is an AlSc alloy layer having very little or substantially no nitrogen. In certain embodiments, the fourth material layer 140 includes at least one or more AlSc alloys, or one or more types of phases such as $Al_2Sc$, AlSc or $AlSc_2$. In some embodiments, the metallic AlSc alloy layer may function as the metal gate layer.

In the previous processes, the first deposition D1, the second deposition D2, the third deposition D3 and the fourth deposition D4 are performed in-situ in the same deposition chamber 1. If the chamber 1 is a PVD chamber, each of the first deposition D1, the second deposition D2, the third deposition D3 and the fourth deposition D4 includes performing a PVD process. If the chamber 1 is a CVD chamber, each of the first deposition D1, the second deposition D2, the third deposition D3 and the fourth deposition D4 includes performing a CVD process. In some embodiments, the first through fourth depositions D1-D4 are performed in-situ as stages of a continuous deposition procedure. By fine-tuning the deposition parameters and reaction conditions, the first material layer 110, the second material layer 120, the third material layer 130 and the fourth material layer 140 are sequentially and continuously formed in-situ in the same chamber without significant interfaces therebetween. In the embodiments of the present disclosure, the term "layer" in the material layer is not intended to limit or define the shape of the material as a sheet but refer to a quantity of the material. In the above-mentioned embodiments, through the same continuous deposition procedure, the first through fourth depositions D1-D4 are performed with the same or similar reactants in varying stoichiometric ratios under different reaction conditions. The resultant material layers, especially the second material layer 120 and the third material layer 130, are formed with compositional gradient regions, and the constituents may gradually vary from one layer to another layer. For example, the atomic ratio or content of a certain element (such as scandium) may gradually increase among the deposited layers. For example, the first material layer 110, the second material layer 120, the third material layer 130 and the fourth material layer 140 are fabricated from the Al—Sc—N (aluminum-scandium-nitrogen) system and are grown in-situ in the same one chamber using a single deposition tool.

Figure 15:
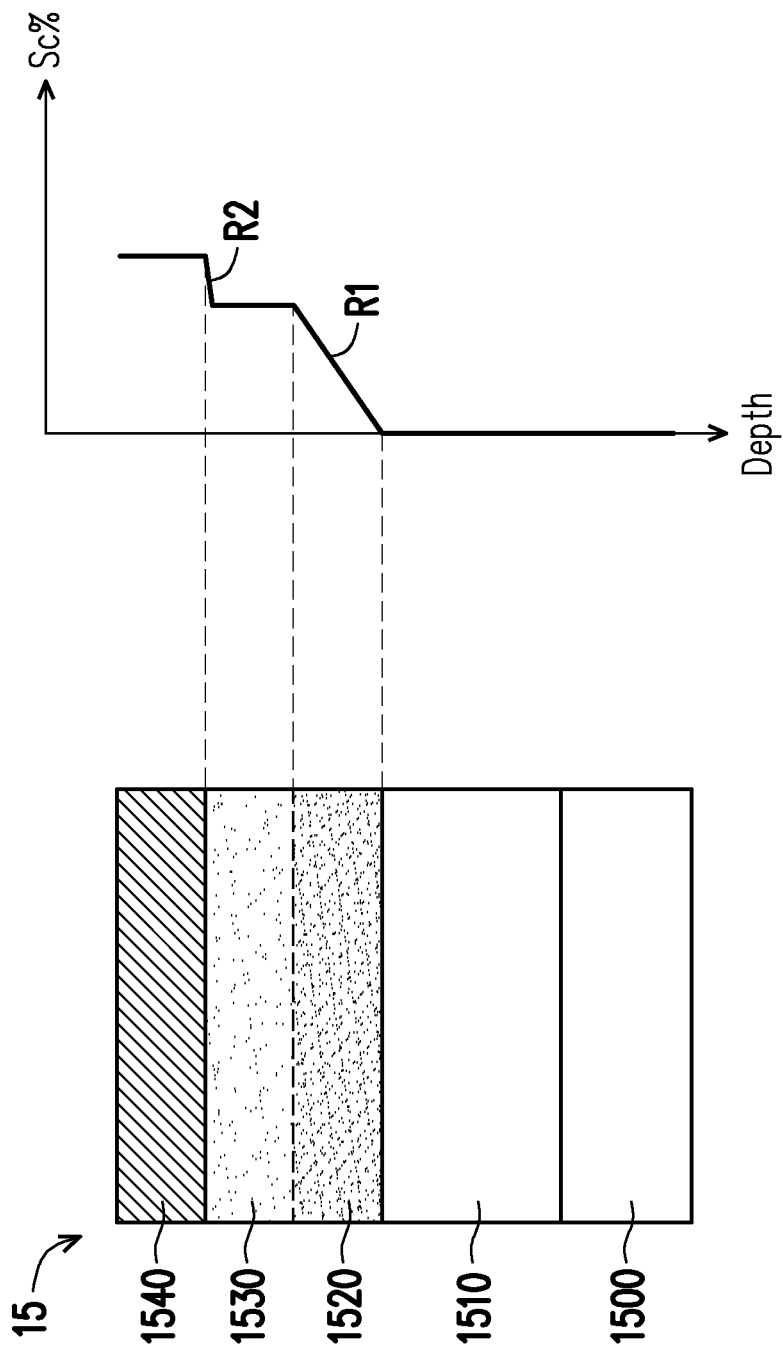
FIG. 15 shows the changes of the scandium contents among the layers of the mass structure in the structure of a transistor device in accordance with some embodiments of the present disclosure.

FIG. 15 shows the changes of the scandium contents among the layers of the mass structure in the structure of a transistor device in accordance with some embodiments of the present disclosure. Looking at the left part of FIG. 15, the mass structure 15 has the first material layer 1510, the second material layer 1520, the third material layer 1530 and the fourth material layer 1540 deposited on the base material 1500. The materials and the formation methods for forming the first material layer 1510, the second material layer 1520, the third material layer 1530 and the fourth material layer 1540 may be substantially the same or similar to those for forming the first material layer 110, the second material layer 120, the third material layer 130 and the fourth material layer 140 respectively. For example, the materials of the first material layer 1510 and the base material 1500 include AlN, the material of the second material layer 1520 includes low-Sc content AlScN material(s), the material of the third material layer 1530 includes high-Sc content AlScN material(s), and the material of the fourth material layer 1540 includes AlSc alloy(s). From the Sc profile example shown at the right part of FIG. 15, it is clear that the Sc content changes along the location (or depth) of the mass structure 15. For the first material layer 1510 and the base material 1500, the Sc content is zero or about zero. For the low-Sc content AlScN material(s) in the second material layer 1520, the Sc content increases gradually with a rise slope R1. For example, the Sc content increases in a linear way from about zero and gradually increasing to about 25% (i.e. 0<Sc<25%). In embodiments, the second material layer 1520 has a single Sc content rise slope, which means a gradual Sc content increase within the entire thickness of the second material layer 1520. For the high-Sc content AlScN material(s) in the third material layer 1530, the Sc content keeps substantially constant at one stage, and the Sc content also increases at the other stage with a rise slope R2. For example, the Sc content increases in a linear way from about 27% and gradually increasing to about 43% (i.e. 27%≤Sc<43%). In some embodiments, the rise slope R2 is larger than the rise slope R1. For example, the rise slope R2 corresponds to the Sc transition between the third material layer 1530 (e.g. ferroelectric layer) and the fourth material layer (i.e. the metal layer) and prefers to be abrupt within a short thickness (a few angstroms or about 0.1 to 0.2 nm). The Sc profile or the changes of the Sc content may be modified or adjusted based on the desirable properties and are not limited to the examples described in this disclosure.

Figure 5:
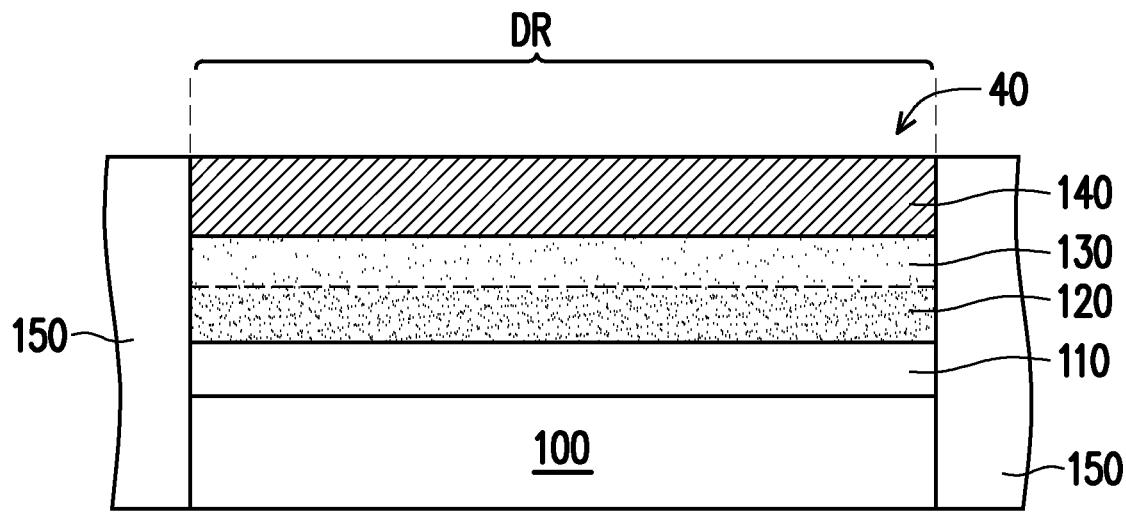

As shown in FIG. 5, in some embodiments, more than one isolation structures 150 are formed in the mass structure 40 to define a device region DR. In certain embodiments, the isolation structures 150 are trench isolation structures penetrating through the fourth material layer 140, the third material layer 130, the second material layer 120 and the first material layer 110 and into the base material 100. In other embodiments, the isolation structures 150 includes local oxidation of silicon (LOCOS) structures. In some embodiments, the insulator material of the isolation structures 150 includes silicon oxide, silicon nitride, silicon oxynitride, a spin-on dielectric material, or a low-k dielectric material. In one embodiment, the insulator material may be formed by CVD such as high-density-plasma chemical vapor deposition (HDP-CVD) and sub-atmospheric CVD (SACVD) or formed by spin-on.

Figure 6:
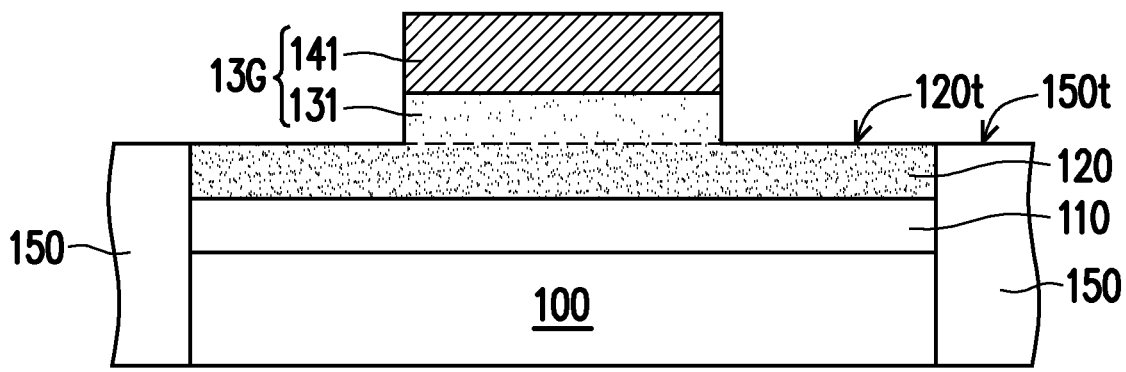

Referring to FIG. 5 and FIG. 6, in some embodiments, a patterning process is performed to the mass structure 40, and the fourth and third material layers 140 and 130 are patterned respectively into a gate layer 141 and a ferroelectric layer 131. The gate layer 141 and the ferroelectric layer 131 form a gate structure 13G located on the second material layer 120 and over the first material layer 110 and the base material 100. During the patterning process, not only portions of the fourth and third material layers 140 and 130 but also the adjacent portions of the isolation structures 150 are removed. That is, the top surface 150t of the patterned portions of the isolation structures 150 are levelled with the top surface 120t of the second material layer 120. The gate structure 13G is located within the device region DR and located between the isolation structures 150. In some embodiments, the gate layer 141 and the ferroelectric layer 131 are patterned into the gate structure 13G in a single patterning process. In some embodiments, the gate layer 141 and the ferroelectric layer 131 are patterned into the gate structure 13G sequentially through multiple patterning processes. As shown in FIG. 6, in exemplary embodiments, the gate structure 13G is disposed on the second material layer with portions of the second material layer 120 exposed. The sidewalls of the gate structure 13G in FIG. 6 may be shown to be vertically aligned or coplanar, and gate structure 13G may be shown to be patterned into substantially the same pattern design or configuration. However, it is understood that the various layers of the gate structure 13G may have different patterns or configurations depending on product designs. In some embodiments, the patterning and the formation of the gate structure 13G include performing a photolithographic process and an anisotropic etching process. In some embodiments, a photoresist pattern (not shown) may be used as an etching mask so that portions of the fourth and third material layers 140 and 130 as well as the isolation structures 150 uncovered by the photoresist pattern are removed during the etching process, and then the photoresist pattern is removed through a stripping process.

Figure 7:
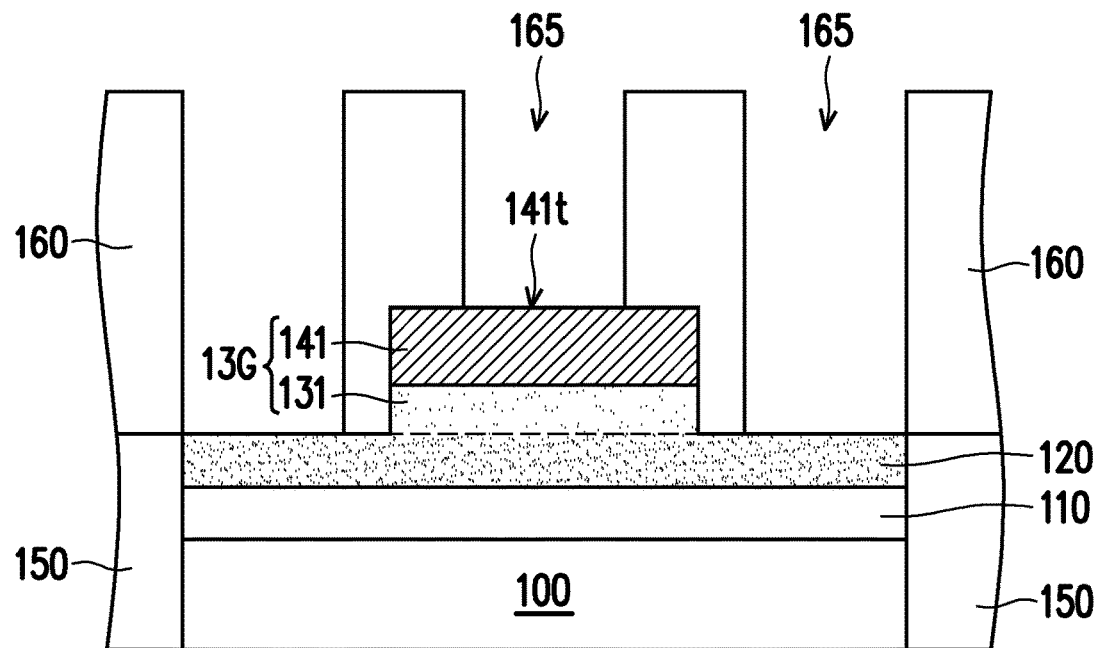

Referring to FIG. 7, an insulating dielectric layer 160 is formed over the second material layer 120 and the isolation structures 150 and fully covering the gate structure 13G. In some embodiments, the material of the insulating dielectric layer 160 includes silicon oxide, silicon nitride, silicon oxynitride, or one or more low-k dielectric materials. Examples of low-k dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzocyclobutenes), or a combination thereof. It is understood that the insulating dielectric layer 160 may include one or more dielectric materials or one or more dielectric layers. In some embodiments, the insulating dielectric layer 160 is formed to a suitable thickness through CVD (such as flowable CVD (FCVD), PECVD, high Density Plasma CVD (HDPCVD), sub-atmospheric CVD (SACVD) and low-pressure CVD (LPCVD)), spin-on coating, or other suitable methods. Optionally, an etching or polishing process may be performed to reduce the thickness of the insulating dielectric layer 160 until a desirable thickness.

In FIG. 7, contact openings 165 are formed in the insulating dielectric layer 160 exposing the second material layer 120 and the gate layer 141 of the gate structure 13G. In some embodiments, the formation of the contact openings 165 includes forming a patterned mask layer (not shown) over the insulating dielectric layer 160, and anisotropic etching the insulating dielectric layer 160 using the patterned mask layer as a mask to form contact openings 165 exposing the second material layer 120 and the gate layer 141. As seen in FIG. 7, the contact openings 165 are shown with substantially vertical sidewalls. It is understood that the contact openings may be formed with tapered or slant sidewalls if feasible.

Figure 8:
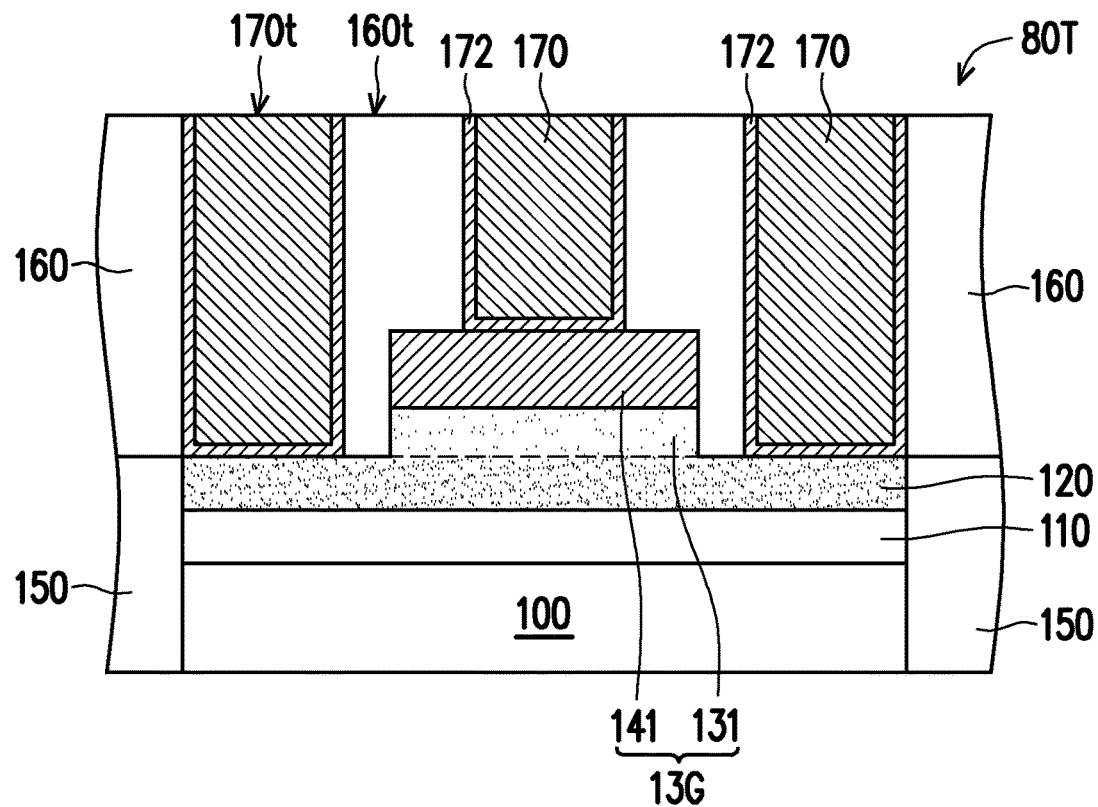

Thereafter, in FIG. 8, contact terminals 170 are formed in the contact openings 165. In some embodiments, a barrier layer 172 is deposited over the contact openings 165 and conformally covers the sidewalls and bottoms of the contact openings 165. In some embodiments, a seed layer (not shown) may be formed over the contact openings 165 and on the barrier layer 172. In some embodiments, the barrier layer 172 is formed to prevent out-diffusion of the metallic material of the metallic contacts. After the barrier layer 172 is formed to cover the sidewalls and the bottoms of the contact openings 165, metallic contact terminals 170 are then formed on the barrier layer 172 within the contact openings 165 and fill the contact openings 165. In some embodiments, a barrier material (not shown) and optionally a seed material are sequentially formed over the contact openings 165 and conformally covering the exposed surfaces of the contact openings 165, and a metallic material (not shown) is then filled into the contact openings 165 and fills up the contact openings 165 to form the metallic contact terminals 170. The barrier material, the seed material and the metallic material may individually include one or more materials selected from tungsten (W), ruthenium (Ru), molybdenum (Mo), tantalum (Ta), titanium (Ti), alloys thereof, and nitrides thereof, for example. In some embodiments, the barrier material is formed by CVD or PVD. In some embodiments, the metallic material is formed by CVD or PVD. In alternative embodiments, the formation of the metallic material may include performing a plating process (such as electrochemical plating (ECP)). In some embodiments, the barrier material includes titanium nitride (TiN) formed by the metal organic CVD (MOCVD) process, the seed material includes tungsten formed by CVD, and the metallic material includes tungsten formed by the CVD process (especially tungsten CVD processes). For example, the contact terminal 170 includes a tungsten contact and the barrier layer 172 includes a titanium nitride barrier layer.

In some embodiments, the extra barrier material, the extra seed material and the extra metallic material may be removed by performing a planarization process, an etching process, or other suitable processes. In some embodiments, the planarization process may include performing a chemical mechanical polishing (CMP) process. As seen in FIG. 8, the top surface 160*t* of the insulating dielectric layer 160 is substantially flush with and levelled with the top surfaces 170*t* of the contact terminals 170. In some embodiments, the contact terminals 170 located on opposite sides of the gate structure 13G function as the source and drain terminals of the transistor, and the contact terminal(s) 170 connected to the gate structure 13G functions as a gate contact. In FIG. 8, a transistor structure 80T is obtained. The transistor structure 80T includes the gate structure 13G having the gate layer 141 and the ferroelectric layer 131 (functioning as the gate dielectric layer), the second material layer 120 (as the channel region) and the first material layer 110 sequentially located on the base material 100 from the top to the bottom, and the contact terminals 170 (as the source and drain terminals) located on opposite sides of the gate structure 13G. The second material layer 120 functions as a conducting channel region, and is connected to the contact terminals 170 at opposite sides of the gate structure 13G functioning as the source and drain terminals.

In the above embodiments, the second material layer 120 also functions as the buffer layer for relaxing the strain of the later formed third material layer 130 so that the resultant third material layer 130 is crystalline or monocrystalline with smaller strain. In addition, as the base material 100 and the first material layer 110 are crystalline, the subsequently formed second and third material layers 120, 130 are crystalline and have good crystalline properties. In some embodiments, the transistor structure 80T is a front-gated transistor structure. In one embodiment, the transistor structure 80T includes a ferroelectric transistor.

In some embodiments, an interconnecting structure having one or multi-leveled routing lines (not shown) may be later formed on the insulating dielectric layer 160 and over the contact terminals 170, and the interconnecting structure may be in direct contact with the contact terminals 170 and/or electrically connected with the contact terminals 170 of the transistor structure 80T, so that the transistor structure 80T is electrically connected further to other components or devices.

In the illustrated embodiments, the described methods and structures may be formed compatible with the current semiconductor manufacturing processes. In exemplary embodiments, the described methods and structures are formed during front-end-of-line (FEOL) processes. In some embodiments, the described methods and structures may be formed during middle-of-line processes or even back-end-of-line (BEOL) processes.

Figure 9:
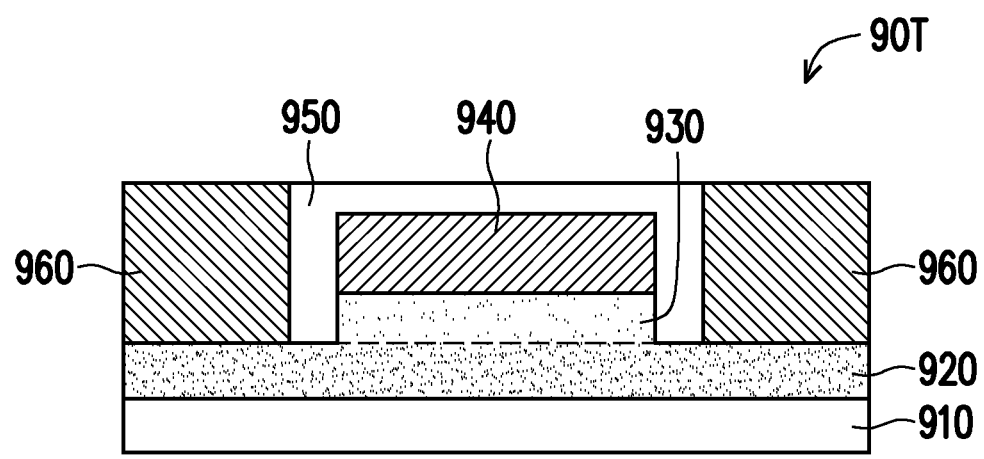
FIG. 9 is a schematic cross-sectional view of a transistor device in accordance with some embodiments of the present disclosure.

FIG. 9 is a schematic cross-sectional view of a transistor device in accordance with some embodiments of the present disclosure. The exemplary structure shown in FIG. 9 may be fabricated following the process steps as described in the previous embodiments as shown from FIG. 1 to FIG. 8, but it is understood that any other compatible process steps or methods may be utilized and comprehensible modifications or adjustments may be made for forming the exemplary structure of this disclosure. Referring to FIG. 9, in some embodiments, the semiconductor device structure 90T includes a first material layer 910, a second material layer 920 disposed on the first material layer 910, a gate structure of a ferroelectric layer 930 and a gate layer 940 located on the second material layer 920 and source and drain terminals 960 disposed directly on the second material layer 920 and located at both opposite sides of the gate structure (from the bottom to the top). In some embodiments, the source terminal and the drain terminal 960 are separate from each other and from the gate structure by an insulating dielectric layer 950 located there-between. In some embodiments, the source and drain terminals 960 each may include a barrier layer (not shown). In some embodiments, the second material layer 920 is in direct contact with the source terminal and drain terminal 960 and the second material layer 920 extending between the source and drain terminals 960 functions as the channel layer. In some embodiments, the insulating dielectric layer 950 sandwiched between the gate structure and the source and the drain terminals 960 is located directly on the second material layer 920. In FIG. 9, the second material layer 920 extends over a whole top surface of the first material layer 910. In FIG. 9, although the gate structure is depicted as being lower than the source and drain terminals, but the gate structure may be substantially the same height as the source and drain terminals. Applicable materials for individual layers or elements are described in the previous embodiments and will not be repeated herein again.

FIG. 10 to FIG. 13 are schematic cross-sectional views showing various stages in a method of forming a transistor device in accordance with some embodiments of the present disclosure.

Figure 10:
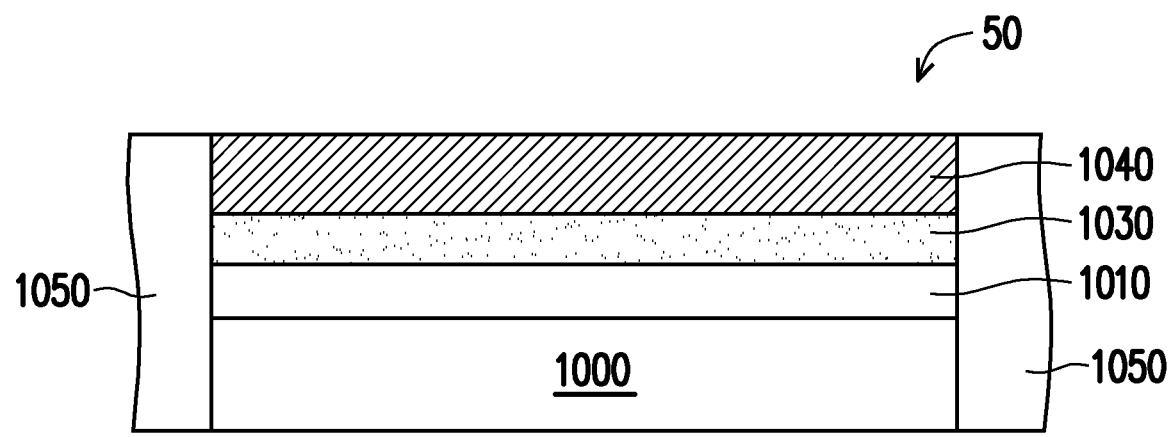
FIG. 10 to FIG. 13 are schematic cross-sectional views showing various stages in a method of forming a transistor device in accordance with some embodiments of the present disclosure.

Referring to FIG. 10, a mass structure 50 formed with isolation structures 1050 is described. The mass structure 50 includes a base material 1000, a first material layer 1010 on the base material 1000, a third material 1030 formed on the first material layer 1010 and a fourth material layer 1040 formed over the third material layer 1030 and above the first material layer 1010. Similar materials and formation methods for forming the material layers in the previous embodiments may be utilized here to form the mass structure 50, except for omitting the formation of the second material layer. In some embodiments, as shown in FIG. 10, within the same deposition chamber 1, the first deposition D1, the third deposition D3 and the fourth deposition D4 are performed within the chamber 1 following the descriptions as described in the above embodiments, so that the first, third and fourth material layers 1010, 1030 and 1040 are formed and grown over the base material 1000.

In one embodiment, within the same PVD chamber, the first deposition D1, the third deposition D3 and the fourth deposition D4 each includes performing a PVD process (such as sputtering) with one or more target sources either functioning and/or non-functioning, and the PVD process involves simultaneously or in turns ejecting the first and second target materials with various or the same ejecting amounts, depending on the property requirement.

In some embodiments, the material of the base material 1000 includes silicon, germanium, gallium arsenide or aluminum nitride or a combination thereof. In one embodiment, the material of the base material 1000 includes a crystalline material. In one embodiment, the first material layer 1010 includes an aluminum nitride (AlN) layer. In one embodiment, the material of the first material layer 1010 includes monocrystalline AlN. In some embodiments, the third material layer 1030 is an AlScN layer having a scandium (Sc) content about or larger than 22% but smaller than 50% (atomic percentage). That is, the third material layer 1030 is a high-Sc content AlScN layer with a Sc content about equivalent to or larger than 22% and smaller than 50% (i.e. 22%≤Sc≤50%), and the Al-rich AlScN may be denoted as $Al_{(1-x)}Sc_{(x)}N$, where $0.27<x<0.43$. In some embodiments, the third material layer 1030 may be formed as a single layer with varying Sc contents or Sc content gradients. In some embodiments, the third material layer 1030 may be formed as multiple layers with different Sc contents or Sc content gradients. In one embodiment, the high-Sc content AlScN layer shall be monocrystalline as it is grown on the monocrystalline first material layer 1010 with minimal strain. The high-Sc content AlScN layer may function as a ferroelectric layer. In some embodiments, the fourth material layer 1040 is an AlSc alloy layer having very little or substantially no nitrogen. In certain embodiments, the fourth material layer 1040 includes at least one or more AlSc alloys, or one or more types of phases such as $Al_2Sc$, AlSc or $AlSc_2$. In some embodiments, the metallic AlSc alloy layer may function as the metal gate layer.

In some embodiments, the first, third and fourth depositions D1, D3 & D4 are performed in-situ as stages of a continuous deposition procedure. In the deposition processes, the first deposition D1, the third deposition D3 and the fourth deposition D4 are performed in-situ in the same deposition chamber or tool. By fine-tuning the deposition parameters and reaction conditions, the first material layer 1010, the third material layer 1030 and the fourth material layer 1040 are sequentially and continuously formed in-situ in the same chamber without significant interfaces therebetween. In the embodiments of the present disclosure, the term "layer" in the material layer is not intended to limit or define the shape of the material as a sheet but refer to a quantity of the material. Through the same continuous deposition procedure, the first, third and fourth depositions D1, D3 & D4 are performed with the same or similar reactants in varying stoichiometric ratios under different reaction conditions. Among the resultant material layers, the constituents may gradually vary from one layer to another layer. For example, the first material layer 1010, the third material layer 1030 and the fourth material layer 1040 are fabricated from the Al—Sc—N (aluminum-scandium-nitrogen) system and are grown in-situ in the same one chamber using a single deposition tool.

Figure 11:
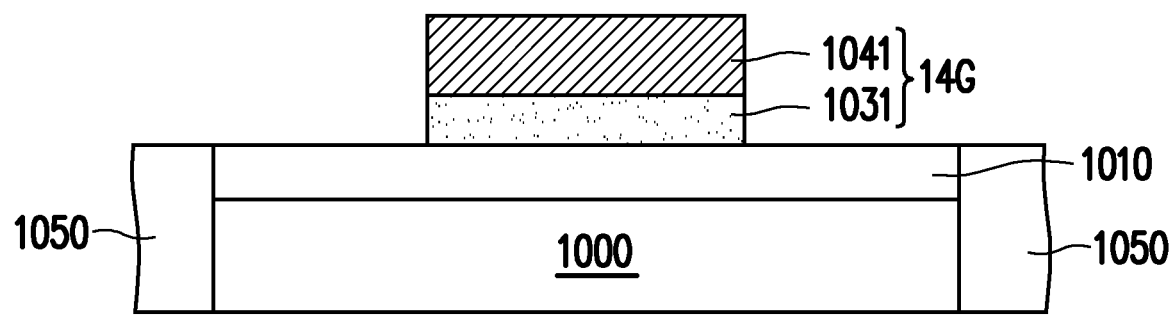

Referring to FIG. 11, a patterning process is performed to the mass structure 50 and the fourth and third material layers 1040 and 1030 are patterned respectively into a gate layer 1041 and a ferroelectric layer 1031. The gate layer 1041 and the ferroelectric layer 1031 form a gate structure 14G located on the first material layer 1010 and over the base material 1000. During the patterning process, not only portions of the fourth and third material layers 1040 and 1030 but also the adjacent portions of the isolation structures 1050 are removed. The gate structure 14G is located between the isolation structures 1050. Any available patterning methods may be used and are not limited to the disclosure herein. As shown in FIG. 11, in exemplary embodiments, the gate structure 14G is disposed on the first material layer 1010 with portions of the first material layer 1010 exposed. It is understood that the various layers of the gate structure 14G may have different patterns or configurations depending on product designs.

Figure 12:
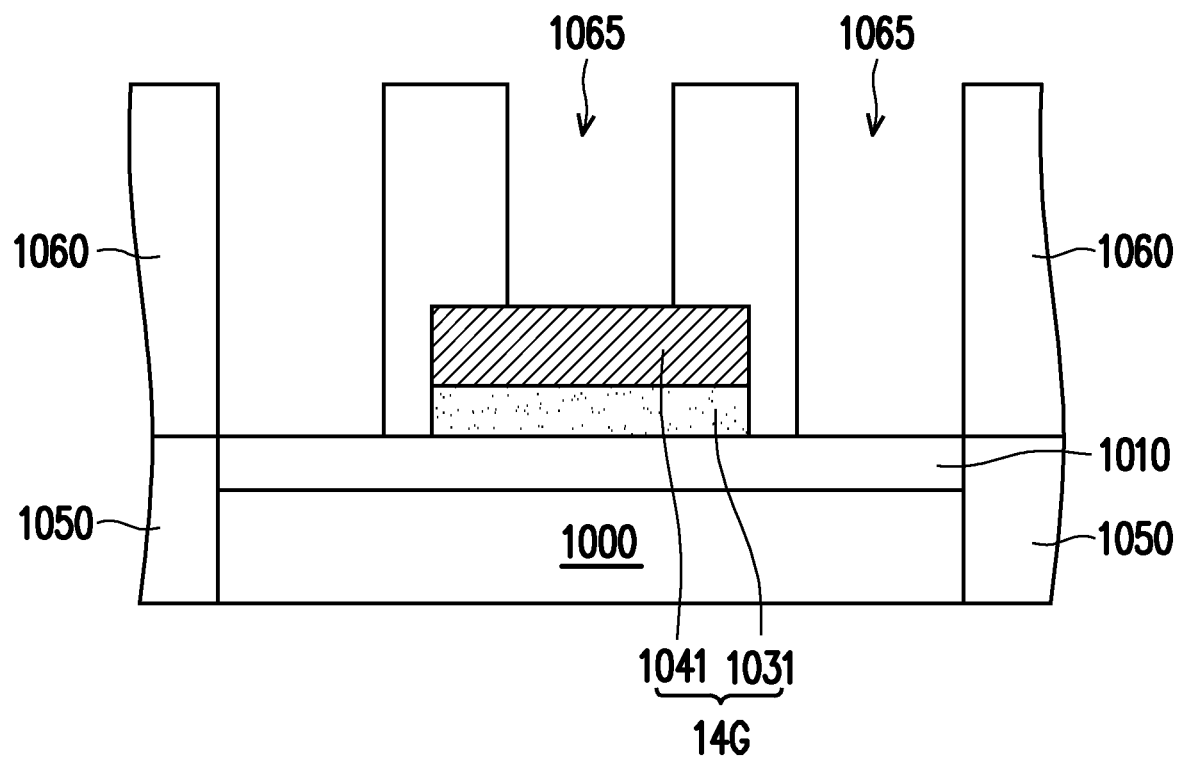

Referring to FIG. 12, an insulating dielectric layer 1060 is formed over the first material layer 1010 and the isolation structures 1050 and fully covering the gate structure 14G. In some embodiments, the material and the formation methods of the insulating dielectric layer 1060 may be substantially the same or similar to those of the insulating dielectric layer 160, and the details will not be described herein again.

In FIG. 12, contact openings 1065 are formed in the insulating dielectric layer 1060 exposing the first material layer 1010 and the gate layer 1041 of the gate structure 14G. In some embodiments, the formation of the contact openings 1065 includes anisotropic etching the insulating dielectric layer 1060 using a mask layer to form contact openings 1065 exposing the first material layer 1010 and the gate layer 1041. In embodiments, the contact openings 1065 may be formed with substantially vertical sidewalls or slant sidewalls if feasible.

Figure 13:
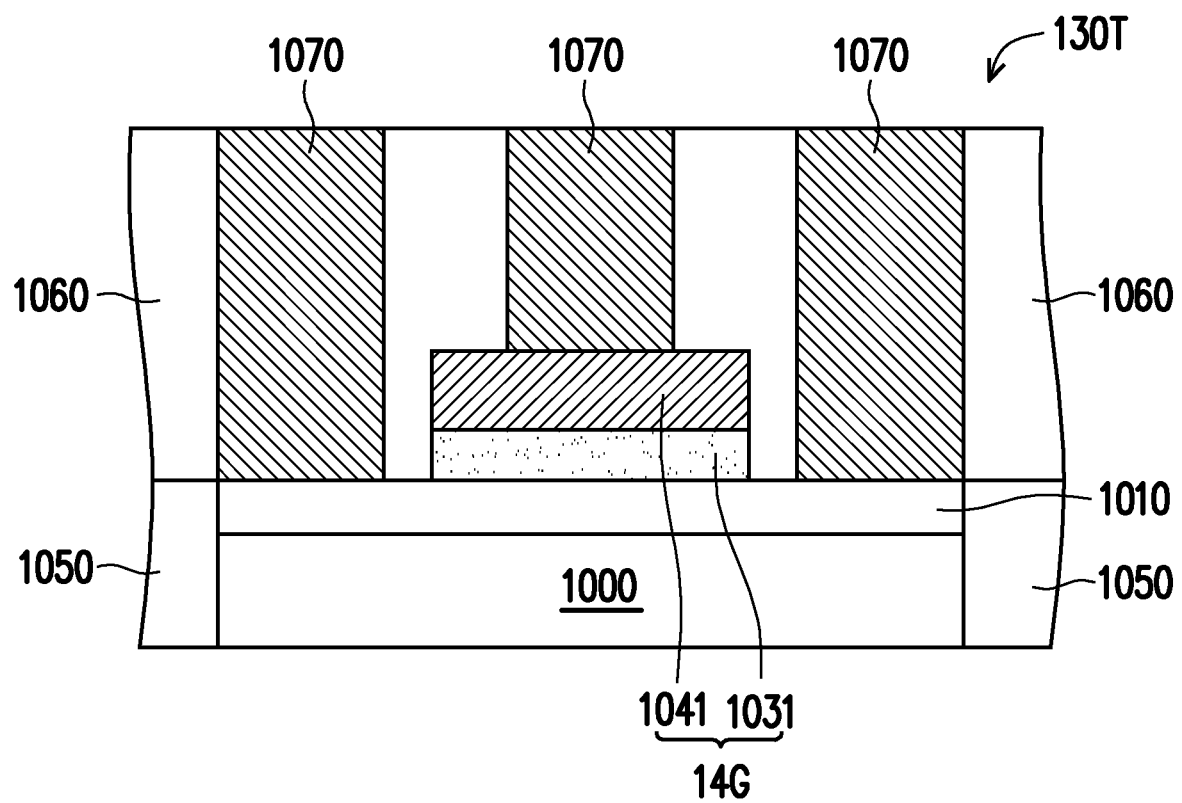

Thereafter, in FIG. 13, contact terminals 1070 are formed in the contact openings 1065. In some embodiments, a barrier layer (not shown) for preventing out-diffusion may be deposited over the contact openings 1065 and conformally covers the sidewalls and bottoms of the contact openings 1065 before forming the metallic contact terminals 1070. After forming the contact openings 1065 and optionally forming the barrier layer, metallic contact terminals 1070 are then formed within the contact openings 1065 and fill up the contact openings 1065. The barrier material, the seed material and the metallic material may individually include one or more materials selected from tungsten (W), ruthenium (Ru), molybdenum (Mo), tantalum (Ta), titanium (Ti), alloys thereof, and nitrides thereof, for example. In some embodiments, the materials and the formation methods of the contact terminals dielectric layer 1060 may be substantially the same or similar to those of the insulating dielectric layer 160, and the details will not be described herein again. In some embodiments, the extra barrier material, the extra seed material and the extra metallic material may be removed by performing a planarization process, an etching process, or other suitable processes. In some embodiments, the planarization process may include performing a chemical mechanical polishing (CMP) process.

As seen in FIG. 13, in some embodiments, the contact terminals 1070 located on opposite sides of the gate structure 14G function as the source and drain terminals of the transistor, and the contact terminal(s) 1070 connected to the gate structure 14G functions as a gate contact. In FIG. 13, a transistor structure 130T is obtained. The transistor structure 130T includes the gate structure 14G having the gate layer 1041 and the ferroelectric layer 1031 (functioning as the gate dielectric layer), the first material layer 1010 (as the channel region) sequentially located on the base material 1000 from the top to the bottom, and the contact terminals 1070 (as the source and drain terminals) located on opposite sides of the gate structure 14G. The first material layer 1010 functions as a conducting channel region, and is connected to the contact terminals 1070 at opposite sides of the gate structure 14G functioning as the source and drain terminals.

In the above embodiments, as the base material 1000 and the first material layer 1010 are crystalline, the later grown third material layer 1030 (i.e. ferroelectric layer 1031) are crystalline and have good crystalline properties. In certain embodiment, the ferroelectric layer 1031 is formed directly on the prior formed first material layer 1010 so that the resultant third material layer 1030 (i.e. the ferroelectric layer 1031) is crystalline or monocrystalline with smaller strain. In some embodiments, the transistor structure 130T is a front-gated transistor structure. In one embodiment, the transistor structure 130T includes a ferroelectric transistor.

Figure 14:
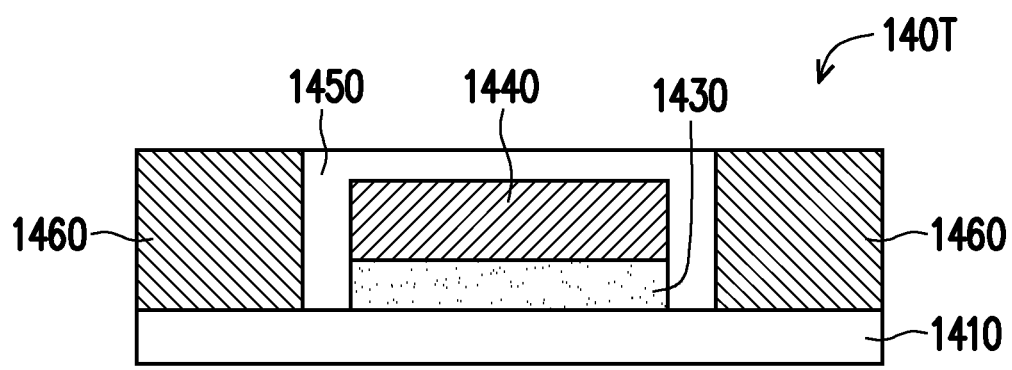
FIG. 14 is a schematic cross-sectional view of a transistor device in accordance with some embodiments of the present disclosure.

FIG. 14 is a schematic cross-sectional view of a transistor device in accordance with some embodiments of the present disclosure. The exemplary structure shown in FIG. 14 may be fabricated following the process steps as described in the previous embodiments as shown from FIG. 10 to FIG. 13, but it is understood that any other compatible process steps or methods may be utilized and comprehensible modifications or adjustments may be made for forming the exemplary structure of this disclosure. Referring to FIG. 14, in some embodiments, the semiconductor device structure 140T includes a first material layer 1410, a gate structure of a ferroelectric layer 1430 and a gate layer 1440 located on the first material layer 1410 and source and drain terminals 1460 disposed directly on the first material layer 1410 and located at both opposite sides of the gate structure. In some embodiments, the source and drain terminals 1460 are separate from each other and from the gate structure by an insulating dielectric layer 1450 located there-between. In some embodiments, the source and drain terminals 1460 each may include a barrier layer (not shown). In some embodiments, the first material layer 1410 is in direct contact with the source terminal and drain terminal 1460 and the first material layer 1410 extending between the source and drain terminals 1460 functions as the channel layer. In some embodiments, the insulating dielectric layer 1450 sandwiched between the gate structure and the source and the drain terminals 1460 is located directly on the first material layer 1410. Applicable materials for individual layers or elements are described in the previous embodiments and will not be repeated herein again.

In the illustrated embodiments, the described methods and structures may be formed during front-end-of-line (FEOL) processes. In some embodiments, the described methods and structures may be formed compatible with the current semiconductor manufacturing processes. In exemplary embodiments, the described methods and structures are formed during back-end-of-line (BEOL) processes. In some embodiments, the described methods and structures may be formed during middle-of-line processes. In one embodiment, the FE-FET device is a logic device.

In the exemplary embodiment, through the continuous single deposition procedure, the layers of good crystal quality in the mass structure are formed in-situ within the same chamber. Also, the layers of the mass structure are formed from the Al—Sc—N (aluminum-scandium-nitrogen) system. As the channel layer made of low-Sc content AlScN or high-Sc content AlScN is of good crystal quality or monocrystalline, more efficient gate control may be achieved and the device performance is enhanced.

In the above-mentioned embodiments, through the same growth procedure, the layers of the mass structure can be formed in-situ without the need for changing or swapping chambers, the growth procedure can be appropriately controlled and the yield is improved.

In some embodiments of the present disclosure, a transistor device is described. The device includes a gate structure having a gate layer and a ferroelectric layer, source and drain terminals, and a crystalline channel portion. The source and drain terminals are disposed at opposite sides of the gate structure. The crystalline channel portion extends between the source and drain terminals. The source and drain terminals are disposed on the crystalline channel portion and the gate structure is disposed on the crystalline channel portion. The crystalline channel portion includes a first material containing a Group III element and a Group V element, the gate layer includes a second material containing a Group III element and a rare-earth element, and the ferroelectric layer includes a third material containing a Group III element, a rare-earth element and a Group V element.

In another embodiment of the present disclosure, a transistor device is described. The transistor device includes a gate layer, a crystalline channel layer, a ferroelectric layer and a source and a drain. The gate layer contains scandium (Sc). The crystalline channel layer is located beneath the gate layer. The ferroelectric layer is disposed between the gate layer and the crystalline channel layer, and the ferroelectric layer contains scandium. The source and the drain are disposed on the crystalline channel layer.

In yet another embodiment of the present disclosure, a method of fabricating a transistor device is described. A base material is placed in a reaction chamber. A crystalline first material layer containing a Group III element and a Group V element is formed on the base material in-situ in the reaction chamber. A crystalline ferroelectric layer containing a Group III element, a rare-earth element and a Group V element is formed on the crystalline first material layer in-situ in the reaction chamber. A metallic gate layer containing a Group III element and a rare-earth element is formed on the crystalline ferroelectric layer in-situ in the reaction chamber.

In yet another embodiment of the present disclosure, a method of fabricating a semiconductor device is described. A first material layer is formed, wherein the first material layer contains crystalline aluminum nitride or aluminum scandium nitride (AlScN) with a first Sc content. A second material layer is formed on the first material layer, wherein the second material layer contains aluminum scandium nitride (AlScN) with a second Sc content higher than the first Sc content. A third material layer is formed on the second material layer, wherein the third material layer contains aluminum scandium (AlSc).

In yet another embodiment of the present disclosure, a method of fabricating a semiconductor device is described. A base material is formed in a reaction chamber. A crystalline first material layer containing a first material is formed on the base material in-situ in the reaction chamber, wherein the first material is crystalline aluminum nitride or aluminum scandium nitride (AlScN) with a first Sc content. A crystalline ferroelectric layer containing a second material is formed on the crystalline first material layer in-situ in the reaction chamber, wherein the second material is aluminum scandium nitride (AlScN) with a second Sc content, and the second Sc content is higher than the first Sc content. A metallic gate layer containing a third material is formed on the crystalline ferroelectric layer in-situ in the reaction chamber, wherein the third material is aluminum scandium (AlSc).

In yet another embodiment of the present disclosure, a method of fabricating a semiconductor device is described. A crystalline channel layer is formed, wherein the crystalline channel layer includes an aluminum scandium nitride layer having a scandium (Sc) content less than about 22%. A ferroelectric layer is formed on the crystalline channel layer, wherein the ferroelectric layer is in contact with the crystalline channel layer and contains scandium. A metallic gate layer is formed on the ferroelectric layer, wherein the metallic gate layer contains scandium (Sc) and aluminum.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:
    forming a first material layer, wherein the first material layer contains crystalline aluminum nitride or aluminum scandium nitride (AlScN) with a first Sc content;
    forming a second material layer on the first material layer, wherein the second material layer contains aluminum scandium nitride (AlScN) with a second Sc content higher than the first Sc content; and
    forming a third material layer on the second material layer, wherein the third material layer contains aluminum scandium (AlSc).

2. The method according to claim 1, wherein the first material layer, the second material layer and the third material layer are respectively formed in-situ in a reaction chamber.

3. The method according to claim 1, wherein the second scandium (Sc) content ranges from about 22% to about 50%.

4. The method according to claim 3, further comprises forming a crystalline semiconductor layer containing a Group III element, a rare-earth element and a Group V element on the first material layer before forming the second material layer.

5. The method according to claim 4, wherein forming the first material layer comprises functioning a Sc target source and a gaseous nitrogen filled in a reaction chamber.

6. The method according to claim 5, wherein forming the crystalline semiconductor layer containing the Group III element, the rare-earth element and the Group V element comprises forming an aluminum scandium nitride layer having a scandium (Sc) content larger than zero but smaller than about 22%.

7. The method according to claim 6, wherein forming the aluminum scandium nitride layer comprises functioning the Sc target source and a second target source comprising the rare-earth element along with the gaseous nitrogen filled in the reaction chamber.

8. The method according to claim 4, wherein at least one of the first material layer and the crystalline semiconductor layer is formed by plasma enhanced CVD (PECVD), low-pressure CVD (LPCVD), metal organic CVD (MOCVD), atomic layer deposition (ALD), molecular beam epitaxy (MBE), evaporation, sputtering or ion plating.

9. A method of fabricating a semiconductor device, comprising:
    placing a base material in a reaction chamber;
    forming a crystalline first material layer containing a first material on the base material in-situ in the reaction chamber, wherein the first material is crystalline aluminum nitride or aluminum scandium nitride (AlScN) with a first Sc content;
    forming a crystalline ferroelectric layer containing a second material on the crystalline first material layer in-situ in the reaction chamber, wherein the second material is aluminum scandium nitride (AlScN) with a second Sc content, and the second Sc content is higher than the first Sc content; and
    forming a metallic gate layer containing a third material on the crystalline ferroelectric layer in-situ in the reaction chamber, wherein the third material is aluminum scandium (AlSc).

10. The method according to claim 9, wherein forming the crystalline first material layer comprises forming a crystalline aluminum nitride layer.

11. The method according to claim 10, wherein forming the crystalline ferroelectric layer comprises forming an aluminum scandium nitride layer having the second Sc content ranging from about 22% to about 50%.

12. The method according to claim 11, further comprises forming a crystalline semiconductor layer containing a fourth material on the crystalline first material layer before forming the crystalline ferroelectric layer, wherein the fourth material is different from the first material.

13. The method according to claim 12, wherein forming the crystalline semiconductor layer comprises forming an aluminum scandium nitride layer having a scandium (Sc) content larger than zero but smaller than about 22%.

14. A method of fabricating a semiconductor device, comprising:
    forming a crystalline channel layer, wherein the crystalline channel layer includes an aluminum scandium nitride layer having a scandium (Sc) content less than about 22%;
    forming a ferroelectric layer on the crystalline channel layer, wherein the ferroelectric layer is in contact with the crystalline channel layer and contains scandium; and
    forming a metallic gate layer on the ferroelectric layer, wherein the metallic gate layer contains scandium (Sc) and aluminum.

15. The method according to claim 14, wherein the ferroelectric layer includes aluminum, scandium and nitrogen.

16. The method according to claim 15, wherein the ferroelectric layer includes an aluminum scandium nitride layer having a Sc content ranging from about 22% to about 50%.

17. The method according to claim 16, wherein the Sc content of the aluminum scandium nitride layer of the crystalline channel layer is gradually increased with a slope.

18. The method according to claim 15, further comprising providing a base material located beneath the crystalline channel layer, and the base material includes aluminum nitride.

19. The method according to claim 14, further comprising forming isolation structures located at opposite sides of the crystalline channel layer, wherein a top surface of the crystalline channel layer is levelled with top surfaces of the isolation structures.

20. The method according to claim 14, further comprising forming a source and a drain are respectively located at two opposite sides of the metallic gate layer and the ferroelectric layer.

* * * * *